United States Patent
Tan et al.

(10) Patent No.: US 8,437,200 B1
(45) Date of Patent: May 7, 2013

(54) ZEROIZATION VERIFICATION OF INTEGRATED CIRCUIT

(75) Inventors: Jun Pin Tan, Kepong (MY); Kiun Kiet Jong, Gelugor (MY)

(73) Assignee: Altera Corporation, San Jose, CA (US)

( * ) Notice: Subject to any disclaimer, the term of this patent is extended or adjusted under 35 U.S.C. 154(b) by 277 days.

(21) Appl. No.: 13/022,144

(22) Filed: Feb. 7, 2011

(51) Int. Cl.
*G11C 7/06* (2006.01)

(52) U.S. Cl.
USPC .................. 365/189.07; 365/201; 714/725

(58) Field of Classification Search .............. 365/189.07, 365/189.08, 201; 714/725
See application file for complete search history.

(56) References Cited

U.S. PATENT DOCUMENTS

| | | | |
|---|---|---|---|
| 7,046,566 B1 * | 5/2006 | Choe et al. ..................... | 365/203 |
| 7,907,460 B2 * | 3/2011 | Ngo et al. ..................... | 365/201 |

* cited by examiner

Primary Examiner — Huan Hoang (74) Attorney, Agent, or Firm — Womble Carlyle Sandridge & Rice, LLP (57) ABSTRACT

Methods and circuits for zeroization verification of the memory in an integrated circuit (IC) are provided. One method includes sequentially reading frames from a block of the memory, and sequentially performing a logical operation between each of the frames and the content of a signature register. The result of the logical operation is stored back in the signature register. In another operation, a hardware logical comparison is made between a device hardwired signature block and the content of the signature register, after the logical operations for all the frames have been performed. The device hardwired signature block is a hardware implemented constant that is unavailable for loading in registers of the IC. The block of the memory is verified to hold a fixed value when the result of the hardware logical comparison indicates that the device hardwired signature block is equal to the content of the signature register.

20 Claims, 6 Drawing Sheets

ZEROIZATION VERIFICATION OF INTEGRATED CIRCUIT

BACKGROUND

Programmable Logic Devices (PLD) are integrated circuit devices with logic that is customizable by a user. To customize a PLD, the PLD is loaded with configuration information, which may be stored in a flash memory chip, disk drive, or other storage device in the system. Upon power-up, the configuration data is loaded from the flash memory chip, or other storage device, into Configuration Random-Access Memory (CRAM) cells in the PLD. The output of each CRAM cell is either a logic high or a logic low signal, depending on the value of the programming data bit stored within the CRAM cell. The output signal from each CRAM cell may be used to control a corresponding circuit element. The circuit element may be a pass gate transistor, a transistor in a logic component (such as a multiplexer or demultiplexer), a transistor in a look-up table, a programmable circuit element in a suitable configurable logic circuit, etc.

When the gate of an N-channel Metal-Oxide-Semiconductor (NMOS) transistor, being controlled by a CRAM cell, is driven high (because the CRAM cell contains a logic "one"), the transistor is turned on so that signals can pass between the drain and source terminals of the transistor. When the gate of the NMOS transistor is driven low (because the CRAM cell contains a logic "zero"), the transistor is turned off. In this way, the transistors on the programmable logic device can be configured, enabling the functionality of the logic in the PLD. The gate of a P-channel Metal-Oxide-Semiconductor (PMOS) transistor may similarly be turned on/off.

Zeroization is a process to erase sensitive data, such as the configuration information, from an electronic module. Zeroization is usually performed to prevent disclosure of the sensitive data if the electronic module is captured or compromised. Some PLD manufacturers offer zeroization of their PLD's in response to the increasing concern of counterfeiting and technology theft. Existing zeroization processes use software-based methodology, need external components, take a long time to complete, and are considered unreliable for users concerned with tampering.

It is in this context that embodiments arise.

SUMMARY

The embodiments described herein provide methods and circuits for verification of the zeroization of memory and registers in an Integrated Circuit (IC). It should be appreciated that the present embodiments can be implemented in numerous ways, such as a process, an apparatus, a system, a device or a method on a computer readable medium. Several embodiments are described below.

In one embodiment, a method includes operations for sequentially reading frames from a block of memory, and for sequentially performing a logical operation between each of the frames and the content of a signature register. The result of the logical operation is stored in the signature register. In another operation, a hardware logical comparison is made between a device hardwired signature block and the content of the signature register, after the logical operations for all the frames have been performed. The device hardwired signature block is a hardware implemented constant that is unavailable for loading in registers of the IC. The block of the memory is successfully verified in response to a match resulting from the performing.

In another embodiment, a verification circuit includes a signature register, a combinational logic circuit, a device hardwired signature block, and a logical comparison circuit. The combinational logic circuit is operable to perform a logical operation between a frame read from a block of a memory and the content of the signature register, and the combinational logic circuit is further operable to store the result of the logical operation in the signature register. The frames from the memory block are read sequentially. The device hardwired signature block is operable to generate a constant logical value that is unavailable for loading in registers coupled to the verification circuit. Further, the logical comparison circuit is operable to compare the device constant logical value with the content of the signature register. The output of the logical comparison circuit identifies whether a zeroization process is successful.

In yet another embodiment, a method for resetting the value of registers in an IC is presented. The method includes operations for sequentially performing a logical operation between the last register in a chain of sequentially linked registers and the content of a signature register, and for storing the result of the logical operation in the signature register. Values of the registers in the chain of sequentially linked registers are shifted, i.e., propagated, in the chain after performing the logical operation, and a first logical value, e.g. a logical 0, is stored in the first register of the chain of sequentially linked registers. Further, the method includes an operation for performing a hardware logical comparison between a device hardwired signature block and the content of the signature register if values from all the registers have been utilized to perform the corresponding logical operation. The device hardwired signature block is a constant implemented in hardware that is unavailable for loading in registers of the IC. Verification that the registers have been loaded with the first logical value is performed in response to a match resulting from the performing, i.e., if the result of the hardware logical comparison indicates that the device hardwired signature block is equal to the content of the signature register.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

DETAILED DESCRIPTION

The following embodiments describe methods and circuits for verifying the zeroization of a block of memory or the zeroization of a set of registers in an Integrated Circuit (IC). In one embodiment, the verification is performed to check that the Configuration Random-Access Memory (CRAM) of a programmable device, e.g., Programmable Logic Device (PLD), Field Programmable Gate Array (FPGA), etc., has been properly zeroized. The proposed circuits and methods also enhance the zeroization verification for Erasable Random-Access Memory (ERAM) and core registers in the IC.

It will be obvious, however, to one skilled in the art, that the present embodiments may be practiced without some or all of these specific details. In other instances, well known process operations have not been described in detail in order not to unnecessarily obscure the present embodiments.

Zeroization is a process to erase sensitive data from an electronic module. Related terms such as zeroized, or zeroed, are also used herein to mean that some portion of memory has been cleared. In some embodiments, clearing a particular memory component refers to storing a logical zero value in the memory, but embodiments can also be applied to a process for storing any suitable desired value, e.g., a logical one, alternating logical zero and one, etc., in the memory to replace a critical value, where this critical value is considered secret. The zeroization process that includes verifying that the data has been cleared is referred to as zeroization verification. Verification time increases linearly with the size of the logic element. Tamper-concerned users wish to verify that, not only that the CRAM has been zeroized, but that the Erasable Random-Access Memory (ERAM) and core registers are also properly zeroized. For example, embodiments can be used to store a configuration in a PLD that is not completely zeroes, and that offers some functionality when programmed in the PLD, but that is different from the critical CRAM configuration to be protected. Thus, it should be noted that the embodiments illustrated herein are exemplary embodiments where memory is filled with zeros.

Other embodiments may utilize different values. The embodiments illustrated herein should therefore not be interpreted to be exclusive or limiting, but rather exemplary or illustrative.

Verification of zeriozation has been described with respect to a PLD. However, it is appreciated that the use of PLD is for illustration purposes and not intended to limit the scope of the present invention. For example, the verification of zeriozation described herein is equally applicable to other programmable devices, e.g., FPGA, etc.

Typically, a PLD is zeroized when tampering is detected in the PLD or in the system where the PLD resides. Some examples include detecting the opening of a military device, the loss of a mobile phone, malware detected in the system, etc. In addition, a device may receive a command to start zeroization, such as a command sent from a mobile phone company when a phone is reported to be lost or stolen.

Embodiments present relatively fast and reliable circuits and methods to zeroize and verify zeroization of storage elements (CRAM, ERAM and core registers) in a PLD, for instance. Built-in circuitry is used to verify that the storage elements have been zeroized. In one embodiment, a 1,000K-LEs device was zeroized in less than 3 ms, which is two orders of magnitude faster than the currently available methods. The additional circuitry incorporated for the embodiments has low area overhead since existing circuitry is also utilized for the zeroization and the zeroization verification.

Figure 1:
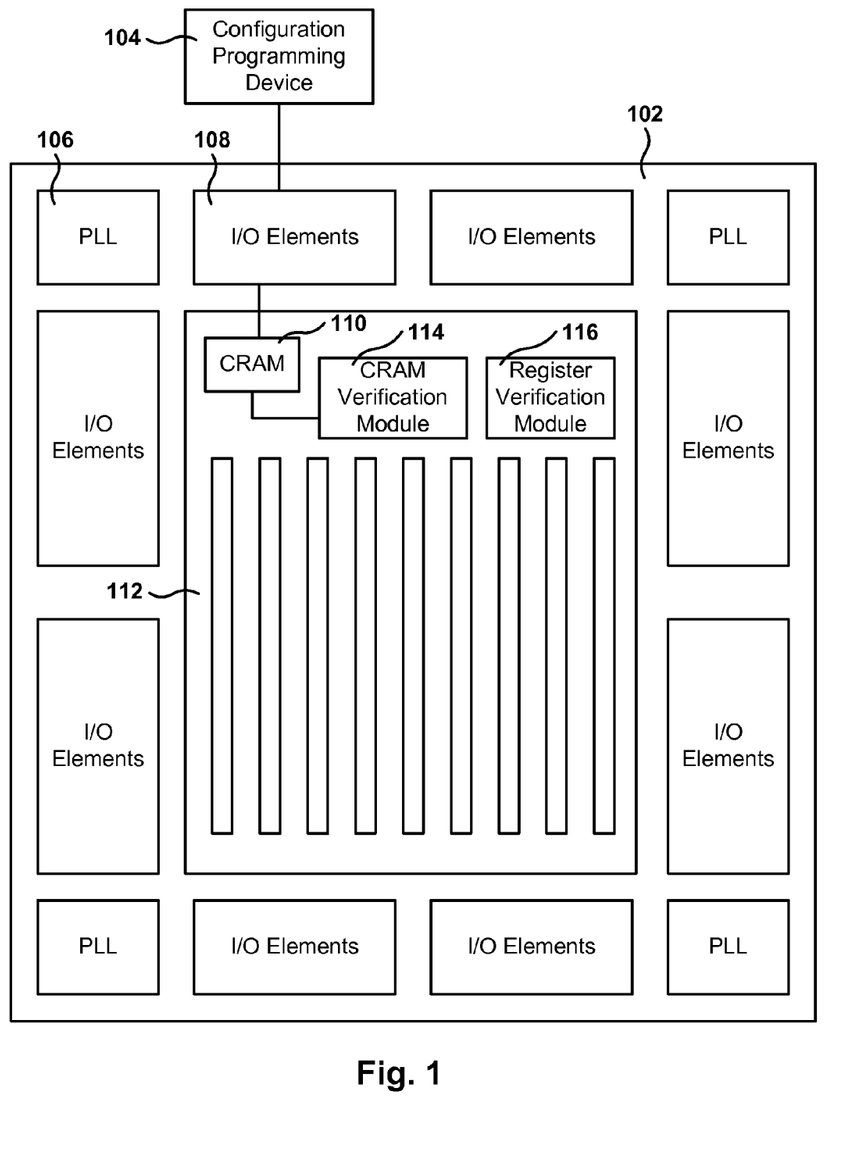
FIG. 1 shows a simplified block diagram of a Programmable Logic Device (PLD) that can include aspects of the exemplary embodiments.

FIG. 1 shows a simplified block diagram of a Programmable Logic Device (PLD) that can include aspects of the exemplary embodiments. PLD 102 includes logic region 112 and Input/Output (I/O) elements 108. I/O elements 108 may support a variety of memory interfaces. Other auxiliary circuits, such as Phase-Locked Loops (PLLs) 106 for clock generation and timing, can be located outside core logic region 112, e.g., at corners of programmable device 102 and adjacent to I/O elements 108. Logic region 112 may be populated with logic cells which include, among other things, "logic elements" (LEs), or programmable Intellectual Property (IP) blocks. LEs may include look-up table-based logic regions and the LEs may be grouped into "Logic Array Blocks" (LABs). The logic elements and groups of logic elements or LABs can be configured to perform logical functions desired by the user.

PLD 102 may further include CRAM memory 110, a CRAM verification module 114, and a register verification module 116. CRAM verification module 114 may be used to verify the zeroization of CRAM memory 110. More details are provided below for CRAM verification module 114 in FIGS. 2 and 3. It should be noted that that CRAM verification module 114 can also be used to verify the zeroization of ERAM memory in the PLD. In addition, register verification module 116 may also be used to zeroize registers in the core as well as to verify that the registers have been zeroized. It should be noted that both verification modules 114 and 116 can operate in parallel because the verification modules may use separate circuitry, resulting in a reduction of the time required for zeroization verification.

Figure 2:
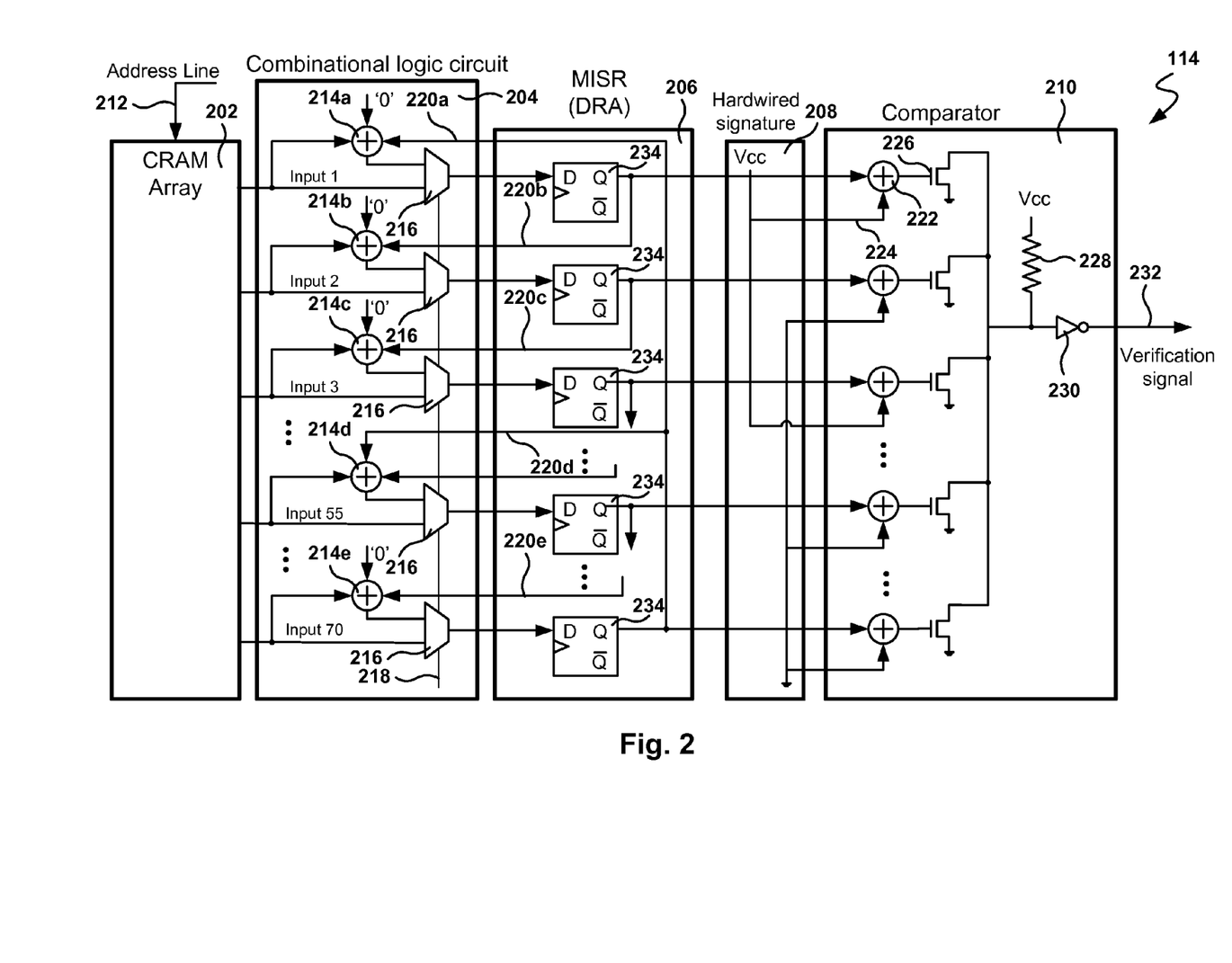
FIG. 2 shows an embodiment of a circuit for zeroization verification of Configuration Random-Access Memory (CRAM) content in accordance with one embodiment.

FIG. 2 shows an embodiment of a circuit for zeroization verification of CRAM content. Zeroization verification circuit 114 is utilized for zeroization verification of the CRAM and the ERAM of the PLD. Described in detail below are methods and circuits for verifying contents of the CRAM. However, one skilled in the art will appreciate that the same methods and circuits may be applied to verify the contents of the ERAM.

Zeroization verification circuit 114 of FIG. 2 includes combinational logic circuit 204, signature register 206, hardwired signature block 208, and comparator 210. Signature register 206 is a Multiple Input Shift Register (MISR) implemented in Data Register A (DRA) of the PLD. Signature register 206 contains a plurality of storage elements 234 that receive as one input the output of a corresponding multiplexer 216 from combinational logic circuit 204. It is appreciated that storage elements 234 may be flip-flops or any other suitable data register in one embodiment. Signature register 206 may include circuitry that calculates the signature associated with the content of CRAM array 202. In one embodiment, the signature associated with CRAM array 202 is the Cyclic Redundancy Check (CRC) value calculated using the circuit of FIG. 2.

To verify zeroization, CRAM memory is read one frame at a time (i.e., sequentially) and each frame is input to combinational logic circuit 204, in one embodiment. The data signal on address line 212 determines which frame is being read from CRAM array 202. The address line is initialized with the first address of the block of the CRAM array being verified, and then the CRAM array is read. Afterwards, the value of the data signal on address line 212 is incremented to read the next frame of CRAM array 202, and the process is repeated until all of the CRAM arrays being verified have been read. In one embodiment, the complete CRAM array 202 is verified, and in another embodiment, only a part of the CRAM array 202 is verified. For example, in one embodiment, every other frame of the CRAM array 202 is read and verified. In this embodiment it is assumed that if every other frame has been properly zeroized, then the complete CRAM array 202 has been zeroized. It should be appreciated that this embodiment allows for enhancing the speed of the zeroization and zeroization verification process. In yet another embodiment, a portion of the CRAM array 202 containing critical information, e.g., the configuration information, may be used for the verification process. In this case, the block of memory read corresponds to the portion of the CRAM array 202 containing the critical information. In one exemplary implementation, each frame may be read in about 5 clock cycles.

Combinational logic circuit 204 of FIG. 2 performs a logical operation utilizing data read from a memory frame of the CRAM array 202 and the content of signature register 206. In one embodiment, the logical operation performs a cyclic redundancy check (CRC), also referred to as a polynomial code checksum. The CRC is a hash function designed to detect accidental changes to raw computer data, and is commonly used in digital networks and storage devices such as hard disk drives. A CRC-enabled device calculates a fixed-length binary sequence, known as the CRC code, for a given block of data. When the block of data is being validated, the CRC calculation is repeated, and if the new CRC does not match the one calculated earlier, then the block contains a data error. The term CRC may refer to the check code or to the function that calculates the CRC. It is appreciated that the function calculating the CRC accepts data streams of any length as input but outputs a fixed-length code.

Still referring to FIG. 2, combinational logic circuit 204 includes multiplexers 216 with common select signal 218 to initialize the content of signature register 206. Combinational logic circuit 204 can obtain its input, not only from the CRAM array 202, but also from other elements, such as a memory register. Accordingly, the signature register 206 can be loaded with the desired initialization value before starting the CRC calculation. In one embodiment, the signature register 206 is initialized with logical zero values, and in another embodiment with logical one values. It should be appreciated that these initialization values are exemplary and not meant to be limiting. It should be appreciated that CRAM cell of the CRAM array is coupled to an address line and a data line of the CRAM array and for illustrative purposes Inputs 1-3 and Inputs 55 and 70 represent couplings to the data line.

Combinational logic circuit 204 of FIG. 2 also includes XOR gates 214a-214e that have inputs from the CRAM array 202, constant logical values (e.g., a logic zero), and particular bits from signature register 206. The interconnections of the combinational logic circuit depend on the CRC being implemented. In the example of FIG. 2, bits in the combinational logic circuit 204 are calculated according to the CRC polynomial, which affects the inputs to the corresponding XOR gates. Therefore, the inputs to each of the XOR gates 214a-214e are not constructed equally and the inputs to each XOR gate depend on the CRC polynomial. In one embodiment, an 86-bit MISR is used and the primitive polynomial for the CRC calculation is $X^{86}+X^{85}+X^{74}+X^{73}+1$, but other polynomials are also possible.

The frames from the CRAM array are read sequentially until all the memory elements of the CRAM array 202 are read, in one embodiment. In another embodiment, only a portion of CRAM array 202 is verified and frames are read until the complete portion of memory being verified is read. For each frame received by combinational logic circuit 204, the logical operation described above is performed and the result is stored in signature register 206. After all CRAM array 202 frames have been read, the CRC value stored in signature register 206 is verified to make sure the zeroization was completed properly. The result of the comparison is a logical value output via verification signal 232, which indicates if there is a match between signature register 206 and hardwired signature block 208.

The string of binary data from the CRAM array 202 creates a unique signature value for the CRAM array 202, which is stored in signature register 206. It should be appreciated that each device has a unique hardwired signature block 208, and when the result of the CRC calculation stored in signature register 206 is equal to hardwired signature block 208, the zeroization verification is characterized as successful.

The hardwired signature block is unique for each device. Different PLDs with different memory sizes and frame sizes will result in different signatures. The hardwired signature block is stored in hardware in the PLD. For example, the hardwired signature block includes a series of logical zero or logical one values that cannot be changed and cannot be accessed from the outside of the PLD. The hardwired signature block is generated from a plurality of traces coupled to one of power or ground. It is appreciated that the hardwired signature block is unavailable for loading in registers or other storage elements of the IC. Thus, the hardwired signature block cannot be read or stored in memory, loaded in a general purpose register, loaded in a Central Processing Unit (CPU), etc. In other words, the hardwired signature block is solely available for comparison with the value stored in signature register 206. It is appreciated that if the hardwired signature block could be read and stored in a register, the hardwired signature block would be available to the logic in the IC and a hacker may be able to access the hardwired signature block to load this value in data register A (the signature register), in order to bypass the security measures to protect the configuration information.

Comparator circuit 210 of FIG. 2 includes a plurality of XOR gates 222. In one embodiment there is one gate for each output bit of signature register 206. Each XOR gate 222 has a bit input from the signature register 206, and a bit input 224 from hardwired signature block 208. The output of each XOR gate 222 is coupled to the gate of a corresponding NMOS transistor 226, which has the drain coupled to power supply $V_{cc}$ through resistor 228. The sources of all NMOS transistors 226 are coupled to ground, and inverter 230 is coupled to resistor 228. Thus, if any NMOS transistor 226 obtains an input value of logic one, the NMOS transistor couples inverter 230 to ground (logic zero), resulting in verification signal 232 being a logical one due to the inversion by inverter 230. On the other hand, when the content of signature register 206 is equal to the hardwired signature block 208, the output of each XOR gate 222 will be a logic zero. As a result, inverter 230 is coupled to Vcc, resulting in the output of the inverter 230 being a logic zero. This output of zero indicates that the zeroization verification has been successful because signature register 206 holds the same value as hardwired signature block 208. An output of one from inverter 230 indicates that the verification has not been successful.

It should be noted that the embodiment illustrated in FIG. 2 is exemplary and other forms of combinational logic may be integrated with the exemplary embodiments. Alternative embodiments may utilize different polynomials, different gates, or different logic values. In addition, the embodiment shown in FIG. 2 shows that the number of inputs to combinational logic circuit 204 is equal to the size of the signature register 206 because the size of each frame read from CRAM array 202 is equal to the size of the signature register 206. Other embodiments may utilize a different size for the frame read from CRAM array 202, which can be higher or lower than the size of the signature register 206. Also, the logic of FIG. 2 can be implemented with other types of logic gates besides XOR gates, such as XNOR gates (the signature register 206 can then be initialized with all ones). It should be further appreciated that signature register 206 operates in parallel to achieve the speed for implementing the verification. The embodiments illustrated herein should therefore not be interpreted to be exclusive or limiting, but rather exemplary or illustrative.

The hardwired signature block may be pre-calculated and stored in hardware in the PLD. That is, the signature is hardwired during the manufacturing of the PLD in the factory because the result of the pre-calculation determines the value of the signature hardcoded in the device. The signature is unique for each device, as each device has a different number of CRAM bits. In one embodiment, the CRAM array is assumed to be filled with zeros as a result of the zeroization.

It should be appreciated that the verification process determines that the complete memory has been zeroized. To arrive at the unique signature of the device, the process is forced to access the CRAM array and perform the CRC calculation. It may appear that simpler methods are available to check that a memory is filled with logic zeros, such as reading the memory and checking that all the values read are equal to logic zero. However, if the memory is simply read and compared to zero, a potential attacker or hacker may trick the system by faking that the memory has been read or by skipping frames. In the embodiments presented above, there is only one way to arrive at the value of the hardwired signature block, which is reading all the CRAM array 202 and verifying that the CRAM array 202 is all zeros using hardcoded logic that is inaccessible to the potential hacker.

The circuit of FIG. 2 reuses existing register DRA. A small amount of logic is added to the PLD (combinational logic circuit 204, hardwired signature block 208, and comparator 210) in order to perform the zeroization verification, resulting in a much faster and reliable verification process.

Figure 3:
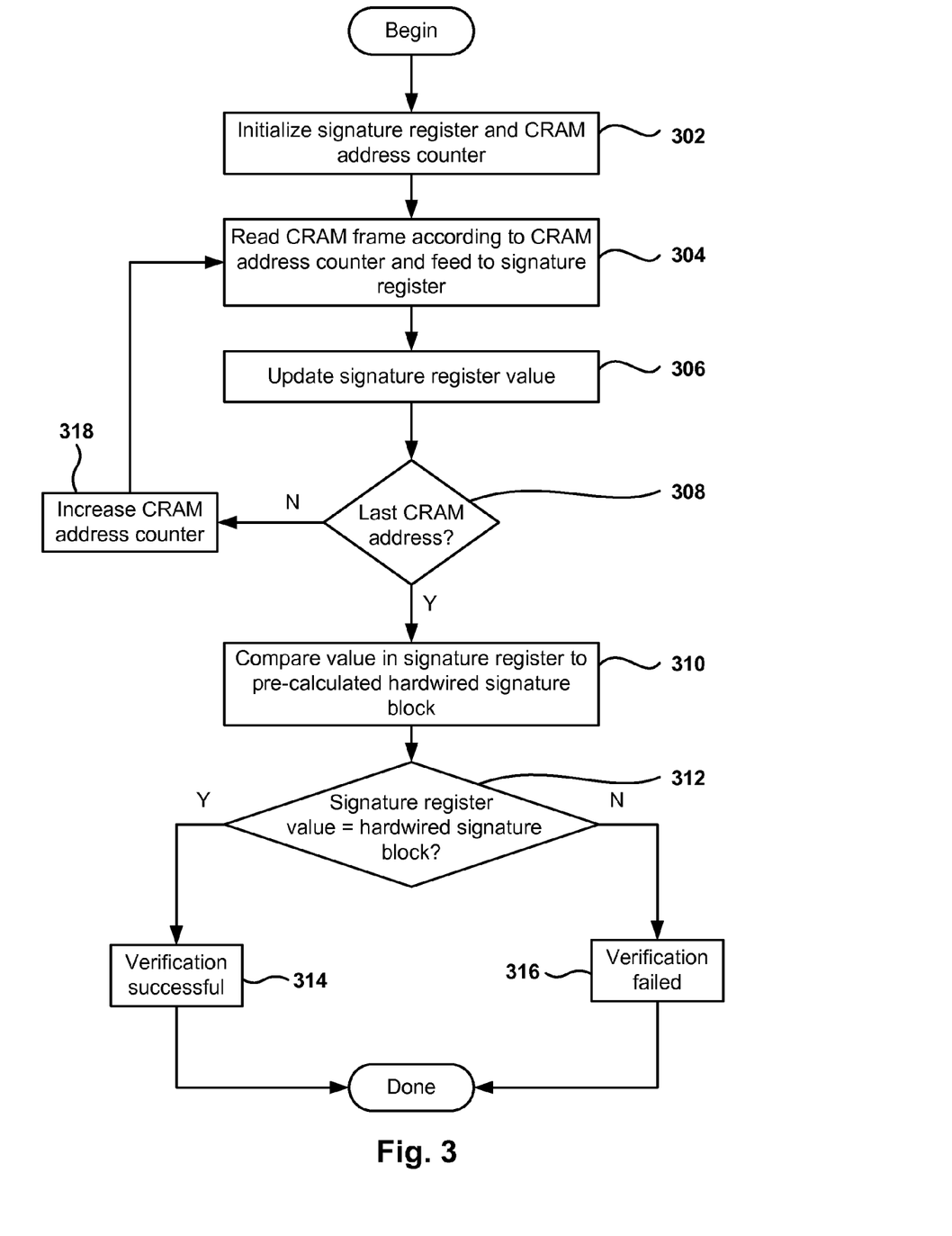
FIG. 3 shows a flowchart illustrating method operations of an algorithm for CRAM zeroization verification in accordance with one embodiment.

FIG. 3 shows a flowchart illustrating an algorithm for CRAM zeroization verification in accordance with one embodiment. In operation 302, an initial value is stored in the signature register. In one embodiment, the signature register is initialized with a zero value. In another embodiment, where XNOR logic is utilized, the signature register is initialized with all ones. The CRAM address counter is also initialized in operation 302. It is, however, appreciated that the signature register may be initialized to any value or combination thereof, e.g., a combination of zeros and ones.

In operation 304, a CRAM frame is read according to the address kept in the CRAM address counter, and the read CRAM frame is used as input to the signature register (through the combination logic circuit). After the CRC calculation, as described above with reference to FIG. 2, the signature register value is updated with the current result of the CRC calculation in operation 306. In operation 308, it is determined if the last CRAM address has been read. If the last address has not been read, the method proceeds to operation 318, where the CRAM address counter is incremented. The method then returns to operation 304 and repeats as described above. If the last CRAM address has been read, the method continues to operation 310, where the CRC value in the signature register is compared to the pre-calculated hardwired value stored in the PLD in decision operation 312.

If the CRC value in the signature register matches the pre-calculated hardwired value, the method continues to operation 314. In operation 314, a zeroization verification-successful signal is generated. If the CRC value does not match the hardwired signature block in operation 312, the method advances to operation 316, where a zeroization verification-failed signal is generated.

Figure 4:
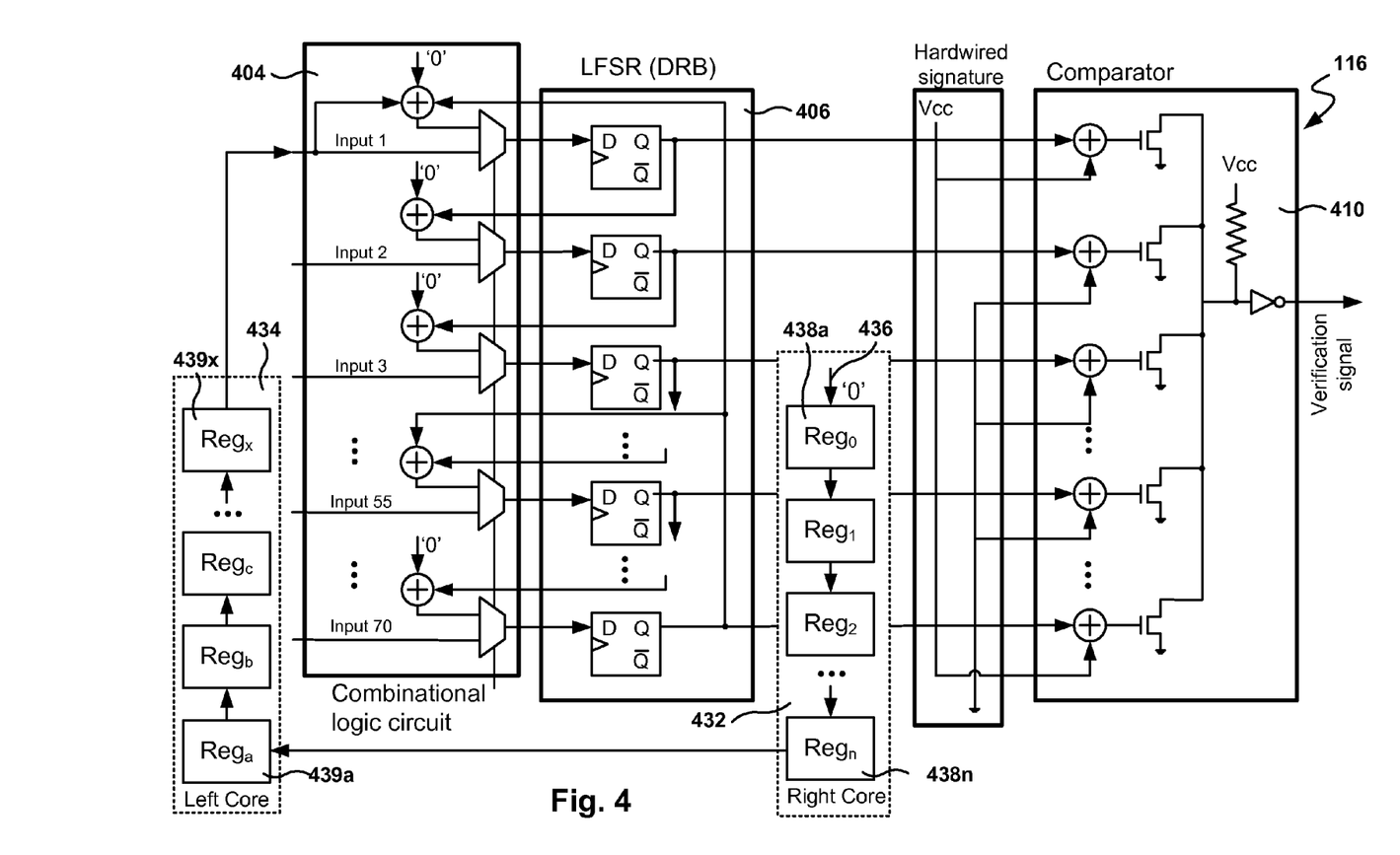
FIG. 4 illustrates an embodiment of a circuit for zeroization of registers in an Integrated Circuit (IC) and for zeroization verification of the registers.

FIG. 4 illustrates an embodiment of a circuit for zeroization of registers in an Integrated Circuit (IC) and for zeroization verification of the registers. The embodiment shown in FIG. 4 differs from the embodiment of FIG. 2 in that a different register is used, Data Register B (DRB), and that the input to the combinational logic circuit is a single bit originating from a register in the core of the IC. It is appreciated that when the data register is being initialized all the inputs are used to load the data register in parallel.

Signature register 406 is a Linear Feedback Shift Register (LFSR) implemented in the DRB. In general, a LFSR is a shift register whose input bit is a linear function of its previous state. In FIG. 4, the input bit does not come from the LFSR directly but rather from a register in the core. The initial value of the LFSR is called the seed.

The PLD core includes a plurality of registers, which can be divided into left core 434 registers and right core 432 registers. In another embodiment, all the registers in the core are included in the plurality of registers, i.e., the division of the registers to a right and a left core is optional. A chain is formed with the registers from the PLD that are being zeroized. In the example of FIG. 4, the first register in the chain is register $Reg_0$ 438a in right core 432, the chain continuing with registers $Reg_1, Reg_2, \ldots,$ and $Reg_n$ 438n, the last register from right core 432. Register $Reg_n$ 438n is linked to the first register $Reg_a$ 439a from left core 434, continuing the chain with the registers in left core $Reg_b, Reg_c, \ldots,$ to $Reg_x$ 439x, the last register in left core 434. The last register in the chain, $Reg_x$ 439x, is the input to combinational logic circuit 404.

After the initialization of signature register 406, each cycle of the signature calculation takes an input from $Reg_x$ 439x, and the chain of registers shifts, which causes the content of $Reg_0$ be loaded into $Reg_1$, the content from $Reg_1$ to be loaded into $Reg_2$, and so on. In addition, a logical zero value 436 is loaded into the first register in the chain $Reg_0$ when the chain shifts. The signature calculation ends when all the original values from the registers have been input to combinational logic circuit 404. Accordingly, if there are N registers, the signature calculation will take N cycles. Since a value of zero is loaded in the chain through the first register $Reg_0$, upon completion of N cycles all the registers will contain a zero value.

In one embodiment, an 86-bit LFSR is used and the primitive polynomial for the CRC calculation may be $X^{86}+X^{85}+X^{74}+X^{73}+1$. After all core registers have been read, the value in signature register 406 is compared to the hardwired signature block using comparator 410, as previously discussed with reference to comparator 210 of FIG. 2. Comparator 410 generates an error signal to indicate whether the signature matches. In one embodiment, when the value in the signature register matches the hardwired signature block, then the verification signal is low, indicating that all registers have been zeroized and that the zeroization has been verified. If the value in the signature register does not match the hardwired signature block, then the verification signal is logic high, indicating that the zeroization has not been successful.

As in the case of FIG. 2, different logic schemes can be used besides the embodiment shown in FIG. 4, such as using XNOR gates instead of XOR gates, and loading the LFSR with all logic ones instead of with all logic zeros. The embodiments illustrated herein should therefore not be interpreted to be exclusive or limiting, but rather exemplary or illustrative. It should be noted that the embodiment of FIG. 2 was used for zeroization verification of the CRAM, while the embodiment of FIG. 4 is used for zeroization verification of the registers in the core. In addition, the embodiment of FIG. 4 also performs the zeroization of the registers in the core.

Figure 5:
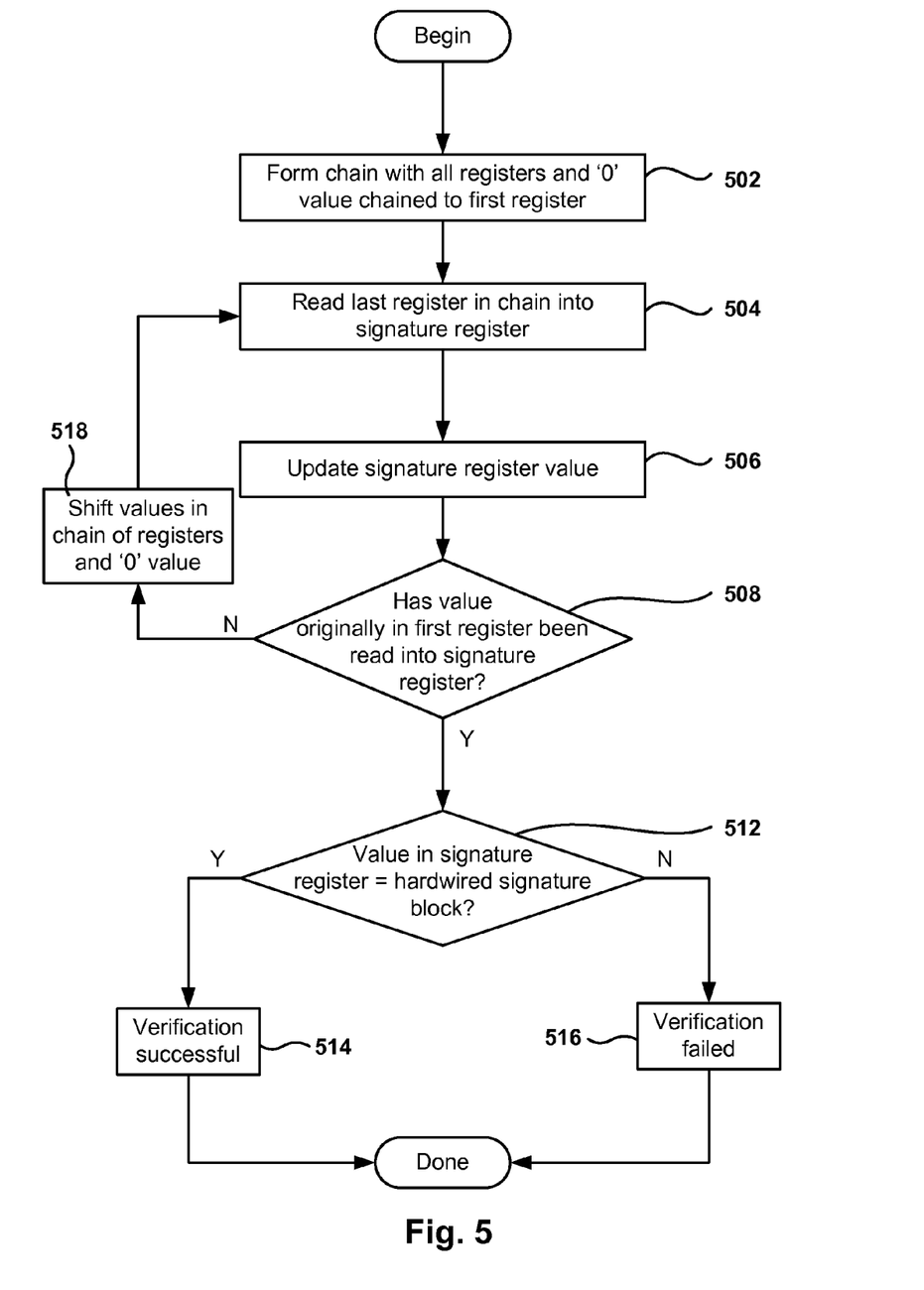
FIG. 5 shows an exemplary flowchart illustrating method operations of an algorithm for zeroization of registers in the IC and zeroization verification, in accordance with one embodiment.

FIG. 5 shows a flowchart illustrating method operations of an algorithm for zeroization of registers in the IC and zeroization verification, in accordance with one embodiment. In operation 502, a chain is formed including all the registers in the core, and a logic value of 0 is added at the beginning of the chain. Thus, as the chain sifts (see operation 518 below) a zero is loaded into the first register.

In operation 504, the last register in the chain is input into the signature register through the combinational logic circuit. The result of the CRC calculation, done via the combinational logic circuit, is utilized to update the signature register in operation 506. After operation 506, the method flows to operation 508 where a check is performed to determine if all the original values in the registers before starting the method operations have been input to the signature register. It is appreciated that one value is loaded at a time, and the values in the registers change as the change shifts the values of the registers. When the value from the first register has been input into the signature register, it means that the value has propagated through all the registers in the chain. If the value originally in the first register has been input into signature register, the method flows to operation 512. If the value originally in the first register has not been read, the method advances to operation 518. In operation 518, all the values in the chain of registers are shifted one position and a logic zero value is loaded into the first register. The method then proceeds to operation 504 and repeats as described above.

In operation 512, the value in the signature register is compared to the hardwired signature block. If the values are the same, the method flows to operation 514, but if the values are different the method flows to operation 516. In operation 514, a zeroization verification-successful signal is generated, and in operation 516 a zeroization verification-fail signal is generated.

Figure 6:
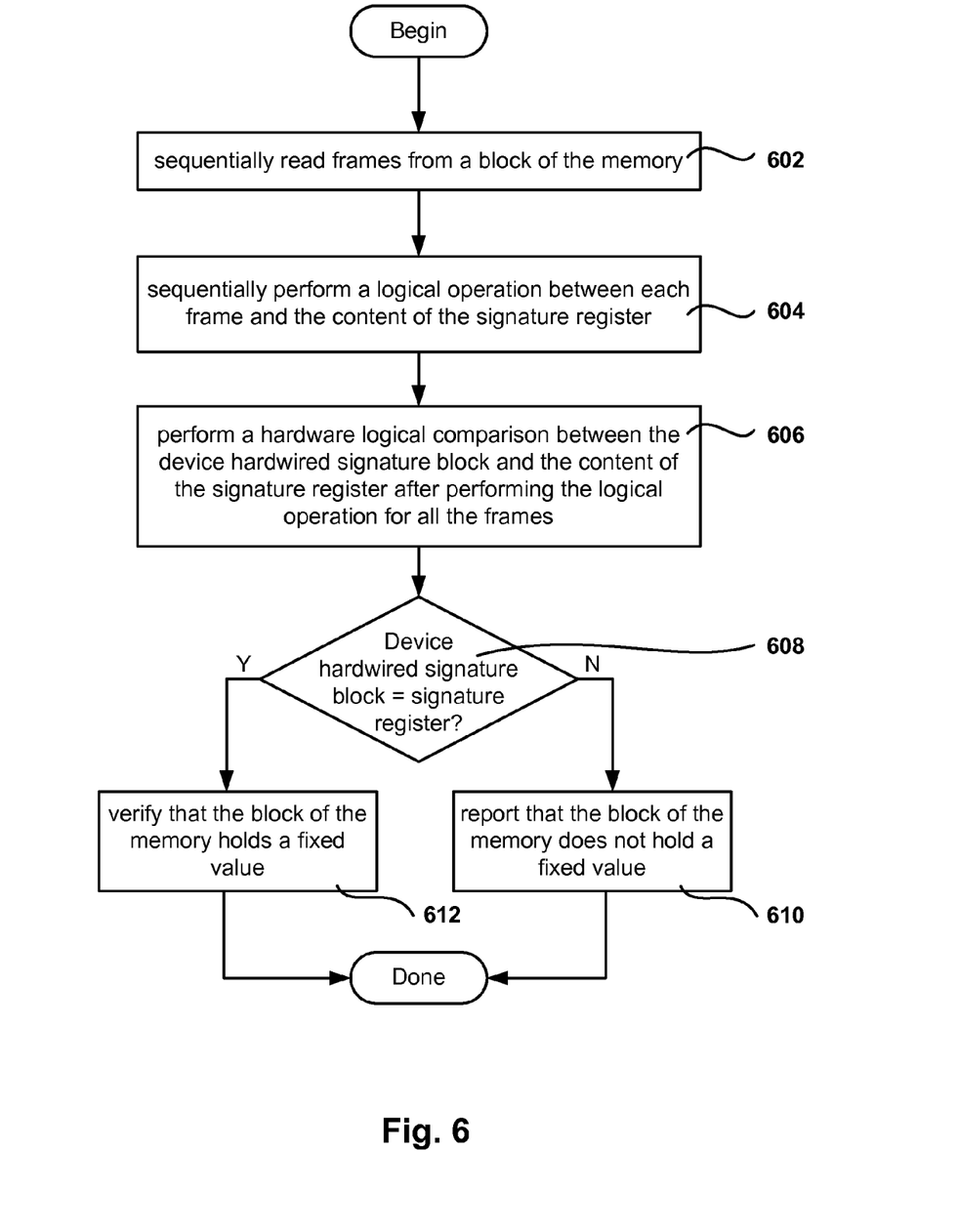
FIG. 6 shows an exemplary flowchart illustrating method operations for verifying content of a memory in the IC, in accordance with one embodiment.

FIG. 6 shows a flowchart illustrating method operations for verifying content of a memory in the IC, in accordance with one embodiment. In operation 602, frames are read sequentially from a block of the memory. In one embodiment, the block of the memory is the CRAM in a PLD as shown in FIG. 2. After operation 602, the method flows to operation 604, where a logical operation is sequentially performed between each read frame and the content of a signature register. Sequentially performing the logical operation refers to performing one logical operation for each read frame, and that each logical operation is performed in a sequence according to each read frame. The result of the logical operation is stored in the signature register (see for example signature register 206 implemented as a MISR in FIG. 2).

In operation 606, a hardware logical comparison between a device hardwired signature block and the content of the signature register is performed, after executing the logical operation for all the frames. The device hardwired signature block is a hardware-implemented constant and is unavailable for loading in registers of the IC as described above. Further, in operation 608, a check is made to determine if the device hardwired signature block is equal to the content of the signature register. If the device hardwired signature block is equal to the value in the signature register, the method proceeds to operation 612, and if the device hardwired signature block is not equal to the signature register, the method proceeds to operation 610. In operation 612, a result is generated that verifies that the block of the memory holds a fixed value. The fixed value is a predetermined constant value stored in the block of memory, such as all logic zeros or all logic ones, although other constant values are also possible. In operation 612, the result generated indicates that the block of the memory does not hold the fixed value, i.e., the block of the memory has not been properly zeroized.

The embodiments, thus far, were described with respect to integrated circuits and PLDs. The method and apparatus described herein may be incorporated into any suitable circuit. For example, the method and apparatus may be incorporated into numerous types of devices such as microprocessor or programmable logic devices. Exemplary of programmable logic devices include Programmable Arrays Logic (PALs), Programmable Logic Arrays (PLAs), Field Programmable Logic Arrays (FPLAs), Electrically Programmable Logic Devices (EPLDs), Electrically Erasable Programmable Logic Devices (EEPLDs), Logic Cell Arrays (LCAs), Field Programmable Gate Arrays (FPGAs), Application Specific Standard Products (ASSPs), Application Specific Integrated Circuits (ASICs), just to name a few.

The programmable logic device described herein may be part of a data processing system that includes one or more of the following components; a processor; memory; input/output circuits; and peripheral devices. The data processing can be used in a wide variety of applications, such as computer networking, data networking, instrumentation, video processing, digital signal processing, or any suitable other application where the advantage of using programmable or reprogrammable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the families of devices owned by the assignee.

Embodiments may be practiced with various computer system configurations including hand-held devices, microprocessor systems, microprocessor-based or programmable consumer electronics, minicomputers, mainframe computers and the like. Embodiments can also be practiced in distributed computing environments where tasks are performed by remote processing devices that are linked through a network.

With the above embodiments in mind, it should be understood that the embodiments can employ various computer-implemented operations involving data stored in computer systems. These operations are those requiring physical manipulation of physical quantities. Any of the operations described herein that form part of the embodiments are useful machine operations. The embodiments also relates to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data may be processed by other computers on the network, e.g., a cloud of computing resources.

One or more embodiments can also be fabricated as computer readable code on a computer readable medium. The computer readable medium is any data storage device that can store data, which can be thereafter be read by a computer system. Examples of the computer readable medium include hard drives, Network Attached Storage (NAS), read-only memory, random-access memory, CD-ROMs, CD-Rs, CD-RWs, magnetic tapes and other optical and non-optical data storage devices. The computer readable medium can include computer readable tangible medium distributed over a network-coupled computer system so that the computer readable code is stored and executed in a distributed fashion.

Although the method operations were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within the scope and equivalents of the appended claims.

What is claimed is:

1. A method for verifying content of a memory in an integrated circuit (IC), the method comprising;
   sequentially reading frames from a block of the memory;
   sequentially performing a logical operation between each frame and content of a signature register, a result of the logical operation being stored in the signature register;
   performing a hardware logical comparison between a device hardwired signature block and the content of the signature register, the device hardwired signature block being a hardware implemented constant that is unavailable for loading in registers of the IC; and
   verifying that the block of the memory is successfully zeroized in response to a match resulting from the performing.

2. The method as recited in claim 1, wherein the logical operation implements a cyclic redundancy check (CRC) of the block of the memory.

3. The method as recited in claim 1, wherein the IC is a programmable logical device (PLD), wherein the memory is configuration random-access memory (CRAM) in the PLD.

4. The method as recited in claim 1, wherein the block of the memory includes an entire CRAM array, and wherein the block of the memory is successfully zeroized when the block of the memory holds all logical zero values.

5. The method as recited in claim 1, further including:
   initializing the signature register with a predetermined value.

6. The method as recited in claim 1, wherein the IC is a programmable logical device (PLD), wherein the device hardwired signature block is created in the PLD when the PLD is manufactured, and wherein the device hardwired signature is incapable of being modified after the PLD is manufactured.

7. The method as recited in claim 1, wherein the device hardwired signature block is solely available to perform the hardware logical comparison and is inaccessible from outside the IC.

8. A verification circuit comprising:
   a signature register;
   a combinational logic circuit operable to perform a logical operation between a frame read from a block of a memory and content of the signature register, wherein the combinational logic circuit is further operable to store a result of the logical operation in the signature register, wherein frames from the block of the memory are sequentially read;
   a device hardwired signature block operable to generate a constant logical value that is unavailable for loading in registers coupled to the verification circuit; and
   a logical comparison circuit operable to compare the constant logical value with the content of the signature register, wherein an output of the logical comparison circuit identifies whether a zeroization process is successful.

9. The verification circuit of claim 8, wherein the logical operation implements a cyclic redundancy check (CRC) of the block of the memory.

10. The verification circuit of claim 8, wherein the combinational logic circuit includes XOR gates coupled to multiplexers, the verification circuit being located within a programmable logic device.

11. The verification circuit of claim 8, wherein the logical comparison circuit includes an XOR gate coupled to a gate of an NMOS transistor, a drain of the NMOS transistor being coupled to a power supply through a resistor, and a source of the NMOS transistor being coupled to ground.

12. The verification circuit of claim 8, wherein the signature register is a multiple input shift register (MISR).

13. The verification circuit of claim 8, wherein the verification circuit is in a programmable logical device (PLD), and wherein the memory is configuration random-access memory (CRAM) in the PLD.

14. The verification circuit of claim 8, wherein the device hardwired signature block is generated from a plurality of traces coupled to one of power or ground.

15. A method for resetting a value of registers in an integrated circuit (IC), the method comprising;
   sequentially performing a logical operation between a last register in a chain of sequentially linked registers and content of a signature register;
   storing a result of the logical operation in the signature register;
   shifting values of registers in the chain of sequentially linked registers and storing a first logical value in a first register of the chain of sequentially linked registers;
   performing a hardware logical comparison between a device hardwired signature block and the content of the signature register if values from all the registers have been utilized to perform the logical operation, the device hardwired signature block being a hardware implemented constant that is unavailable for loading in registers of the IC; and
   verifying that the registers have been loaded with the first logical value in response to a match resulting from the performing.

16. The method as recited in claim 15, further including:
   generating the device hardwired signature block through a plurality of traces coupled to one of a source of a first logical value and a source of a second logical value.

17. The method as recited in claim 15, wherein the IC is a programmable logical device (PLD).

18. The method as recited in claim 15, further including:
   initializing the signature register with a predetermined value.

19. The method as recited in claim 15, wherein the IC is a programmable logical device (PLD), wherein the device hardwired signature block is created in the PLD when the PLD is manufactured, and wherein the device hardwired signature is incapable of being modified after the PLD is manufactured.

20. The method as recited in claim 15, wherein the device hardwired signature block is inaccessible to environment external to the IC.

* * * * *